(12) United States Patent
Teramoto et al.

(10) Patent No.: US 8,624,600 B2
(45) Date of Patent: Jan. 7, 2014

(54) CURRENT DETECTING DEVICE

(75) Inventors: Toshiyo Teramoto, Okazaki (JP); Jyun Ozawa, Chiryu (JP)

(73) Assignee: Denso Corporation, Kariya (JP)

( * ) Notice: Subject to any disclaimer, the term of this patent is extended or adjusted under 35 U.S.C. 154(b) by 403 days.

(21) Appl. No.: 13/017,604

(22) Filed: Jan. 31, 2011

(65) Prior Publication Data

US 2011/0187346 A1    Aug. 4, 2011

(30) Foreign Application Priority Data

Jan. 29, 2010  (JP) ................................. 2010-017876
Jul. 5, 2010   (JP) ................................. 2010-152685

(51) Int. Cl.
*G01V 3/00*   (2006.01)

(52) U.S. Cl.
USPC ........... 324/354; 324/348; 324/347; 320/119; 320/132; 320/136

(58) Field of Classification Search
USPC ............... 324/76.11, 348, 357, 354; 320/119, 320/132, 136
See application file for complete search history.

(56) References Cited

U.S. PATENT DOCUMENTS 8,142,237 B2 *  3/2012  Condamin et al. ............ 439/762
2008/0030208 A1  2/2008  Aratani

FOREIGN PATENT DOCUMENTS

JP    A-2008-39571    2/2008

* cited by examiner

*Primary Examiner* — Arleen M Vazquez
*Assistant Examiner* — Alesa Allgood
(74) *Attorney, Agent, or Firm* — Oliff & Berridge, PLC

(57) ABSTRACT

A current detecting device includes a second fixed part to which the harness is fixed and electrically connected, a bus bar as a resistor inserted between a first fixed part and the second fixed part, a circuit board in which a current detection circuit is mounted, the current detection circuit detecting current flowing through the bus bar based on a potential difference between two points along an energizing direction of the bus bar, and a case accommodating the bus bar and the circuit board. The second fixed part to which the harness is fixed and electrically connected is disposed within a battery upper surface area.

9 Claims, 6 Drawing Sheets

CURRENT DETECTING DEVICE

CROSS-REFERENCE TO RELATED APPLICATION

This application is based on and claims the benefit of priority from earlier Japanese Patent Applications No. 2010-17876 filed Jan. 29, 2010 and No. 2010-152685 filed Jul. 5, 2010, the descriptions of which are incorporated herein by reference.

TECHNICAL FIELD

The present disclosure relates to a current detecting device equipped in a passenger car, a truck, etc. that detects charging/discharging current of a battery.

BACKGROUND

A current sensor has been known that is provided with a current detection circuit accommodated within a case in an intermediate portion of a flat bus bar in the length direction (refer to, for example, JP-A-2008-39571).

In the current sensor, the bus bar configures a ground terminal. The current sensor is attached to the negative terminal side of a battery and detects the charging/discharging currents of the battery.

The bus bar of the current sensor disclosed in JP-A-2008-39571 has a long, flat shape to ensure current detection accuracy.

Because a first connecting section and a second connecting section connected to respective attached members are formed at the tips of the bus bar in the length direction, when the distance between the first and second connecting sections is long, moment force is generated against the attached member connected to the first connecting section with the second connecting section as a point of action.

In particular, when a battery terminal is considered as the attached member connected to the first connecting section, excessive moment force is applied to the battery terminal, leading to reduced fastening strength of the battery terminal and damage to the battery terminal.

A problem occurs in that quality and vibration-resistance of the battery terminal may deteriorate during vehicle assembly.

SUMMARY

An embodiment provides a current detecting device capable of improving quality and vibration-resistance of a battery terminal during vehicle assembly.

In a current detecting device that detects a current flowing through a battery terminal to a harness according to a first aspect, the current detecting device includes a fixed part to which the harness is fixed and electrically connected; a resistor inserted between the battery terminal and the fixed part; a circuit board in which a current detection circuit is mounted, the current detection circuit detecting current flowing through the resistor based on a potential difference between two points along an energizing direction of the resistor; and a case housing the resistor and the circuit board.

The fixed part to which the harness is fixed and electrically connected is disposed within a battery upper surface area.

As a result of the fixed part being disposed on the battery upper surface area, even when a load is applied when the harness is fixed to the fixed part, the amount of deflection of the fixed part in the load direction can be reduced. Therefore, excessive moment can be prevented from being applied to the battery terminal.

As a result, reduction in fastening strength of the battery terminal and damage to the battery terminal can be prevented, and the quality and vibration-resistance of the battery terminal during vehicle assembly can be improved.

Furthermore, because the overall current detecting device including the fixed part or the main section thereof is contained within the battery upper surface area, the space on the battery upper surface can be effectively used, and mounting properties are enhanced.

In the current detecting device according to a second aspect, the above-described resistor preferably has a non-linear shape. Specifically, the non-linear shape is a shape that is folded back midway and of which at least a portion is overlapping. Alternatively, the non-linear shape is a C-shape or an L.-shape.

As a result, distance between the battery terminal and the fixed part can be shortened, and moment force applied to the battery terminal when the harness is fixed to the fixed part can be further reduced.

In the current detecting device according to a third aspect, the above-described fixed part is preferably disposed within a circular area that is within the battery upper surface area and has a radius from the center of the battery terminal that is a radius of the battery terminal multiplied by a predetermined value.

Specifically, the above-described predetermined value is preferably 3.5. The moment force applied to the battery terminal when a predetermined fastening force is applied to the fixed part is proportional to the distance between the battery terminal and the fixed part.

On the other hand, when the same moment force is applied as described in the present disclosure, the moment force can be dispersed and received in proportion to a battery terminal diameter. Therefore, reduction in the fastening strength of the battery terminal and damage to the battery terminal can be prevented.

Therefore, as a result of limiting the ratio of the battery terminal diameter to the distance between the battery terminal and the fixed part, the moment force applied to the battery terminal during fastening of the fixed part can be dispersed. The quality and vibration-resistance of the battery terminal can be improved with certainty.

In the current detecting device according to a fourth aspect, the above-described fixed part is preferably any of a bolt that is attached and fixed, an attaching hole that is formed in a penetrating manner, and a crimped terminal.

As a result of forming the fixed part by any of the bolt, the attaching hole, and the crimped terminal, variation of the harness position on the vehicle side can be increased, and attaching properties can be improved.

In the current detecting device according to a fifth aspect, attachment is preferably performed in a state in which the lower surface of the above-described fixed section is in contact with the battery upper surface.

As a result, the amount of deflection of the fixed part when the harness is fixed to the fixed part can be kept to a minimum, and the moment force applied to the battery terminal can be minimized.

Therefore, the quality and vibration-resistance of the battery terminal during vehicle mounting can be further improved.

In the current detecting device according to a sixth aspect, a cut-out section is preferably formed in the above-described case within the battery upper surface area. The battery terminal and the fixed part are each preferably provided such as to oppose the cut-out section.

A terminal provided in the battery within the battery upper surface area is preferably disposed in the cut-out section. Specifically, the battery terminal and the fixed part are each preferably provided in a position adjacent to the cut-out section.

As a result of the cut-out section being provided in the case of the current detecting device, and the terminal of the battery, and the battery terminal and the fixed part of the current detecting device being collectively disposed within or near the cut-out section in this way, the distance between each fastening section thereof can be shortened.

Therefore, the moment force applied during fastening or during use can be reduced.

BRIEF DESCRIPTION OF THE DRAWINGS

In the accompanying drawings:
FIG. 3 is a diagram of a specific example of a circuit in the current detecting device, and an example of connection with a battery or the like.

DETAILED DESCRIPTION OF THE PREFERRED EMBODIMENTS

A current detecting device according to an embodiment in which the present disclosure is applied will hereinafter be described in detail with reference to the drawings.

The current detecting device according to the embodiment is, for example mounted on and fixed to a negative-side terminal of a lead battery for a vehicle, and can be used to detect charge and discharge currents of the battery.

Figure 1:
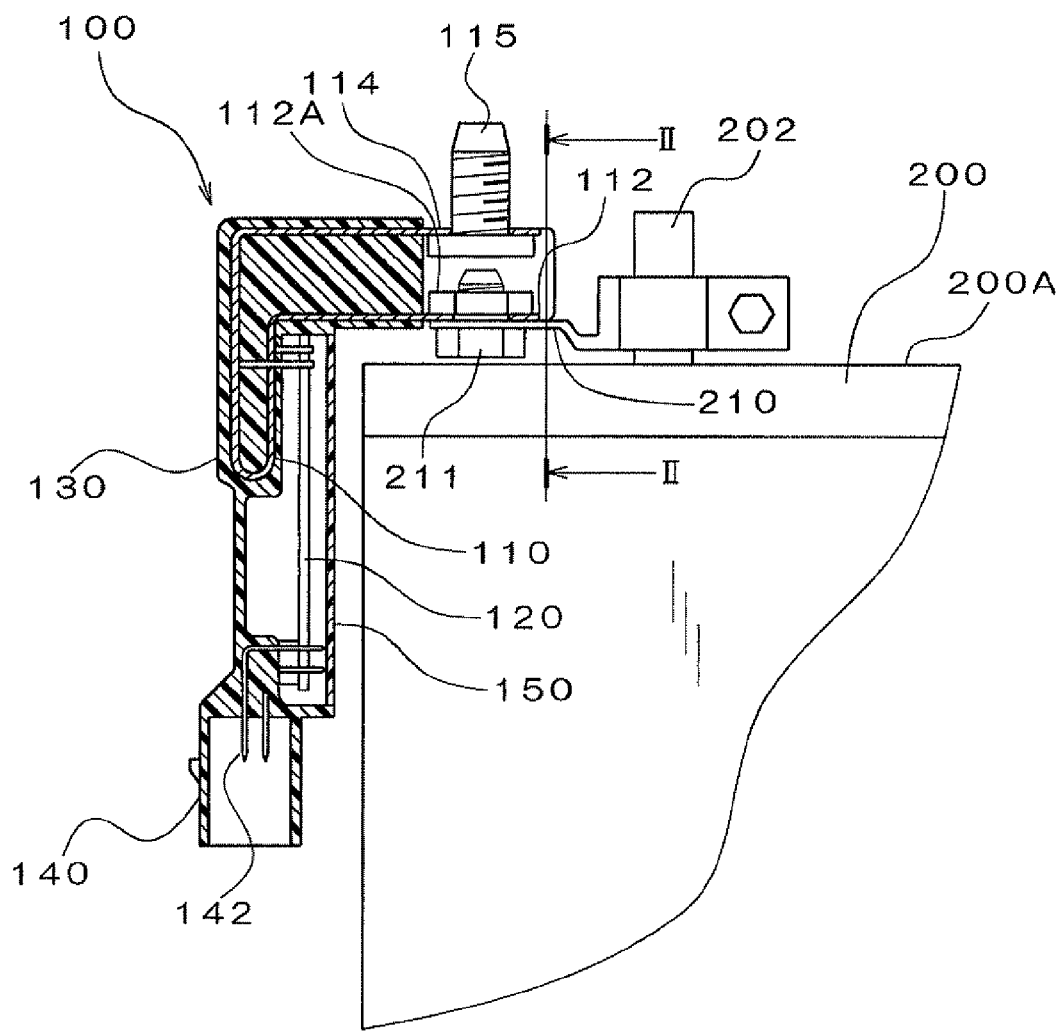
FIG. 1 is a cross-sectional view of a configuration of a current detecting device according to an embodiment.
Figure 2:
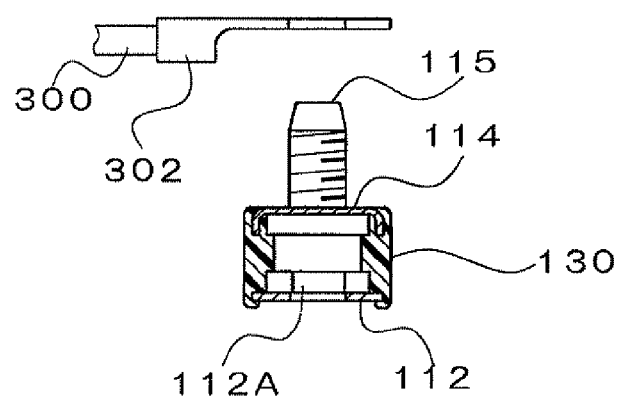
FIG. 2 is a cross-sectional view taken along line II-II in FIG. 1.

FIG. 1 is a cross-sectional view of a configuration of the current detecting device according to the embodiment, showing a state in which the current detecting device is attached to the battery. FIG. 2 is a cross-sectional view taken along line II-II in FIG. 1.

A current detecting device 100 according to the embodiment shown in the drawings includes: a bus bar 110 serving as a resistor (shunt resistor) formed using a conductive material; a circuit board 120 on which a current detection circuit is mounted, the current detection circuit detecting a current flowing through the bus bar 110 based on a potential difference between two points along the energizing direction of the bus bar 110; a case 130 housing the bus bar 110 and the circuit board 120; a connector 140, inside of which a plurality of connector terminals 142 are exposed, the connector terminals 142 being electrically connected with the circuit board 120; and a lid 150 that seals an opening of a recess in the case 130 housing the circuit board 120.

The bus bar 110 is shaped such as to be folded back and overlapping within the case 130.

One end of the bus bar 110 forms a first fixed section 112 that is fixed to an attachment fitting serving as a connection terminal on the battery 200 side and electrically connected.

The other end of the bus bar 110 forms a second fixed section 114 that is fixed to a harness and electrically connected. The bus bar 110 is formed by press-molding a single plate-shaped member.

According to the present embodiment, the main section (the section housing the circuit board 120) of the case 130 having an overall rectangular shape is disposed near a side surface of the battery 200 (the side surface closest to a terminal 202 of the battery 200 to which the current detecting device 100 is attached) such as to project vertically.

The remaining section (the section in which the first and second fixed parts 112 and 114 are formed) is disposed on an upper surface 200A of the battery 200.

The first fixed part 112 has a flat shape. A through-hole is formed in a portion of the flat shape. A nut 112A is fixed to the upper side of the through-hole. On the other hand, as shown in FIG. 1, an attachment fitting 210 is attached to the negative-side terminal 202 of the battery 200.

The attachment fitting 210 serves both to attach the current detecting device 100 and as a wiring between the negative-side terminal 202 and the first fixed part 112. A through-hole for inserting a bolt 211 in the upward direction is provided in the end of the attachment fitting 210.

According to the embodiment, the bolt 211 is inserted upward through the through-hole in the attachment fitting 210. The bolt 211 is then inserted into the nut 112A in a state in which the attachment fitting 210 and the flat-shaped portion of the first fixed part 112 are sandwiched therebetween, and the first fixed part 112 is fastened and fixed to the attachment fitting 210. Then, the attachment fitting 210 is attached to the negative-side terminal 202 of the battery 200.

In addition, a through-hole is provided near the end of the second fixed part 114. A bolt 115 is inserted into the through-hole. On the other hand, a terminal 302 having a through-hole is provided at the end of a harness 300 that is electrically connected to the second fixed part 114.

The bolt 115 provided in the second fixed part 114 is inserted into the through-hole in the terminal 302. The terminal 302 is fastened with a nut (not shown), thereby fixing the terminal 302 to the second fixed part 114.

According to the present embodiment, the case 130 is formed by a resin material having favorable insulation and heat-transmission properties, such as PPS (Polyphenylenesulfide). The bus bar 110 is insert-molded using the resin material.

Next, the position of the second fixed part 114 will be described. As described above, the second fixed part 114 is disposed within an area (battery upper surface area) of the upper surface 200A of the battery 200 in which the harness 300 is fixed and electrically connected. The second fixed part 114 is disposed in a position overlapping the first fixed part 112.

As a result of the second fixed part 114 being disposed on the battery upper surface area in this way, even when a load is applied to the second fixed part 114 when the harness 300 is fixed, the amount of deflection of the second fixed part 114 in the load direction can be suppressed.

Therefore, excessive moment can be prevented from being applied to the first fixed part 112 serving as a battery terminal. As a result, reduction in the fastening strength of the first fixed part 112 and damage to the first fixed part 112 can be prevented, and quality and vibration-resistance of the battery terminal during vehicle assembly can be improved.

Further, because the overall current detecting device 100 including the second fixed part 114 or the main section thereof is contained within the battery upper surface area, space on the battery upper surface 200A can be effectively used, and mounting properties are improved.

Furthermore, although workability, such as battery replacement, deteriorates when auxiliary machines are mounted in the space on the battery upper surface 200A, when the current detecting device 100 is mounted, the attachment fitting 210 is removed when battery replacement or the like is performed.

Therefore, the current detecting device 100 can be removed at the same time, and deterioration of workability does not particularly occur.

Figure 3:
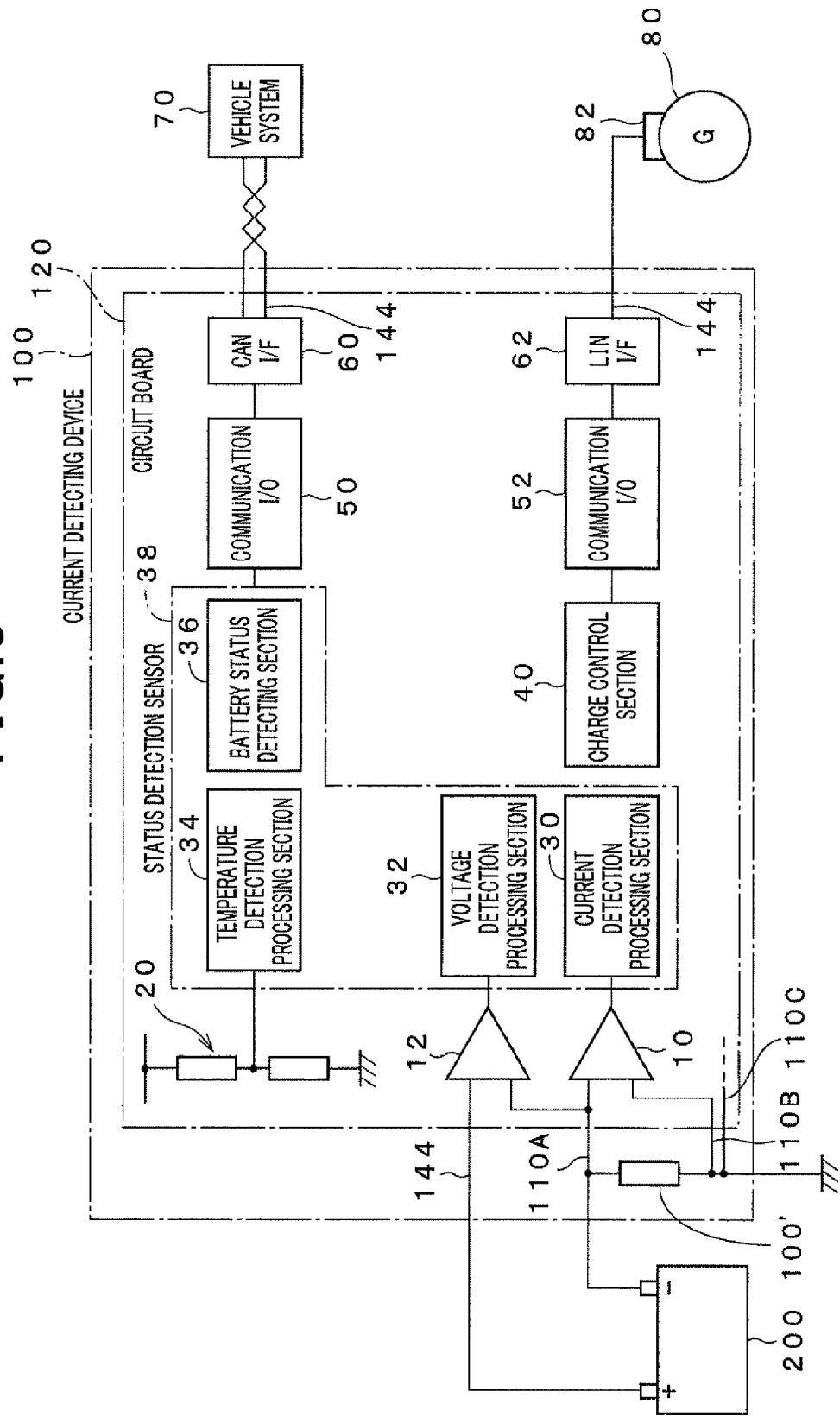

FIG. 3 is a diagram of a specific example of the circuit in the current detecting device 100, and an example of connection with the battery 200 or the like.

As shown in FIG. 3, the circuit board 120 of the current detecting device 100 includes: a differential amplifier 10 connected to both ends of a shunt resistor 100' serving as a resistor formed by a portion of the bus bar 110; a differential amplifier 12 connected to the positive terminal and the negative terminal of the battery 200; a temperature detecting section 20; a current detection processing section 30; a voltage detection processing section 32; a temperature detection processing section 34; a battery status detecting section 36; a charge controlling section 40; communication input and output section (communication I/O) 50 and 52; a CAN interface (CAN I/F) 60 that transmits and receives data based on CAN protocol; and a LIN interface (LIN I/F) 62 that transmits and receives data based on LIN protocol.

One differential amplifier 10 amplifies the voltage across the shunt resistor 100'. The current detection processing section 30 detects the current flowing to the shunt resistor 100' based on the output voltage of the differential amplifier 10.

The differential amplifier 10 and the current detection processing section 30 configure a current detection circuit. The other differential amplifier 12 converts the voltage across the battery 200 (battery voltage) to an appropriate level. The voltage detection processing section 32 detects the battery voltage based on the output voltage of the differential amplifier 12.

The temperature detecting section 20 is configured by a voltage divider circuit composed of a resistor and a thermistor. The resistance value of the thermistor changes depending on the temperature and the divided voltage of the voltage divider circuit changes.

The temperature detection processing section 34 detects the temperature of the current detecting device 100 (temperature of the battery 200) based on the output voltage (divided voltage) of the temperature detecting section 20.

The battery status detecting section 36 loads the detection values of the current detection processing section 30, the voltage detection processing section 32, and the temperature detection processing section 34, and generates a battery status signal.

The current detection processing section 30, the voltage detection processing section 32, the temperature detection processing section 34, and the battery status detecting section 36 configure a status detection sensor 38.

The charge controlling section 40 controls a power generation state of a vehicle power generator (G) 80 based on the battery status signal generated by the battery status detecting section 36.

The power generation control is performed by an instruction being sent to a power generation controlling device 82 mounted in the vehicle power generator 80, via the communication I/O 52 and the LIN I/F 62.

The battery status signal generated by the battery status detecting section 36 is sent to a vehicle system via the communication I/O 50 and the CAN I/F 60.

The vehicle system 70 performs integrated control of an engine and various electrical loads based on the received battery status signal and the like.

The differential amplifier 10 and the current detection processing section 30, described above, configure the current detection circuit.

According to the above-described embodiment, the second fixed part 114 and the first fixed part 112 are disposed in positions such as to overlap with each other in the up-down direction. However, the positions may be shifted within a predetermined range.

Furthermore, the first fixed part 112 may be directly attached to the negative side terminal 220 of the battery 200 without the attachment fitting 210 therebetween.

Figure 4:
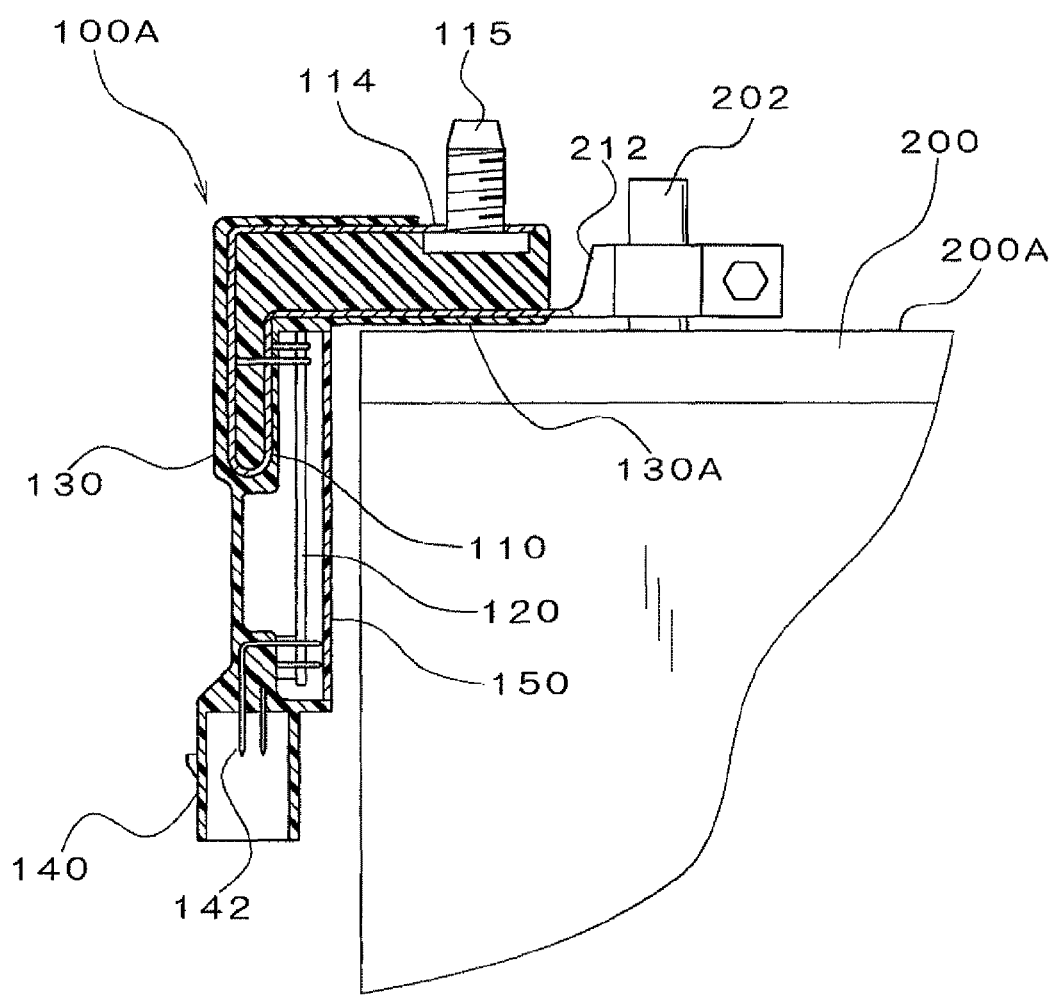
FIG. 4 is a cross-sectional view of a configuration of a variation example of the current detecting device.

FIG. 4 is a cross-sectional view of a configuration of a variation example of the current detecting device. A current detecting device 100A shown in FIG. 4 differs from the current detecting device 100 shown in FIG. 1 in that the attachment fitting 210 and the first fixed part 112 shown in FIG. 1 are integrally formed and, as a whole, form a first fixed part 212.

In the current detecting device 100A, when a fastening force is applied to the bolt 115 of the second fixed part 114 and a load is applied in the vertical direction when the harness 300 is attached, the second fixed part 114 becomes a point of action, and the first fixed part 212 attached to the negative side terminal 202 of the battery 200 becomes a point of support.

The respective positions of the first and second fixed parts 212 and 114 are set such that the center of the second fixed part 114 is disposed within a circular area that, from the center of the first fixed part 212, has a radius that is the radius of the first fixed part 212 (radius of the negative-side terminal 202) multiplied by a predetermined value. Specifically, the predetermined value is preferably 3.5.

When a predetermined fastening force is applied to the second fixed part 114, the moment force applied to the first fixed part 212 is proportional to the distance between the first fixed part 212 and the second fixed part 114.

On the other hand, when the same moment force is applied, the moment force can be dispersed and received in proportion to the diameter of the first fixed part 212 (diameter of the negative-side terminal 202).

Therefore, reduction in the fastening strength of the first fixed part 212 and damage to the first fixed part 212 can be suppressed.

Therefore, by limiting the ratio of the diameter of the first fixed part 212 to the distance between the first fixed part 212 and the second fixed part 114, the moment force applied to the first fixed part 212 when the second fixed part 114 is fastened can be dispersed.

As a result, quality and vibration-resistance of the first fixed part 212 can be improved with certainty.

With the distance between the first fixed part 212 and the second fixed part 114 set to L, when the moment applied to the battery terminal in relation to (distance L/battery terminal radius) is actually determined, the moment becomes greater in proportion to (distance L/battery terminal radius).

It has been confirmed that, when (distance L/battery terminal radius) exceeds 3.5, the allowable moment in relation to damage to the battery terminal is exceeded.

Figure 5:
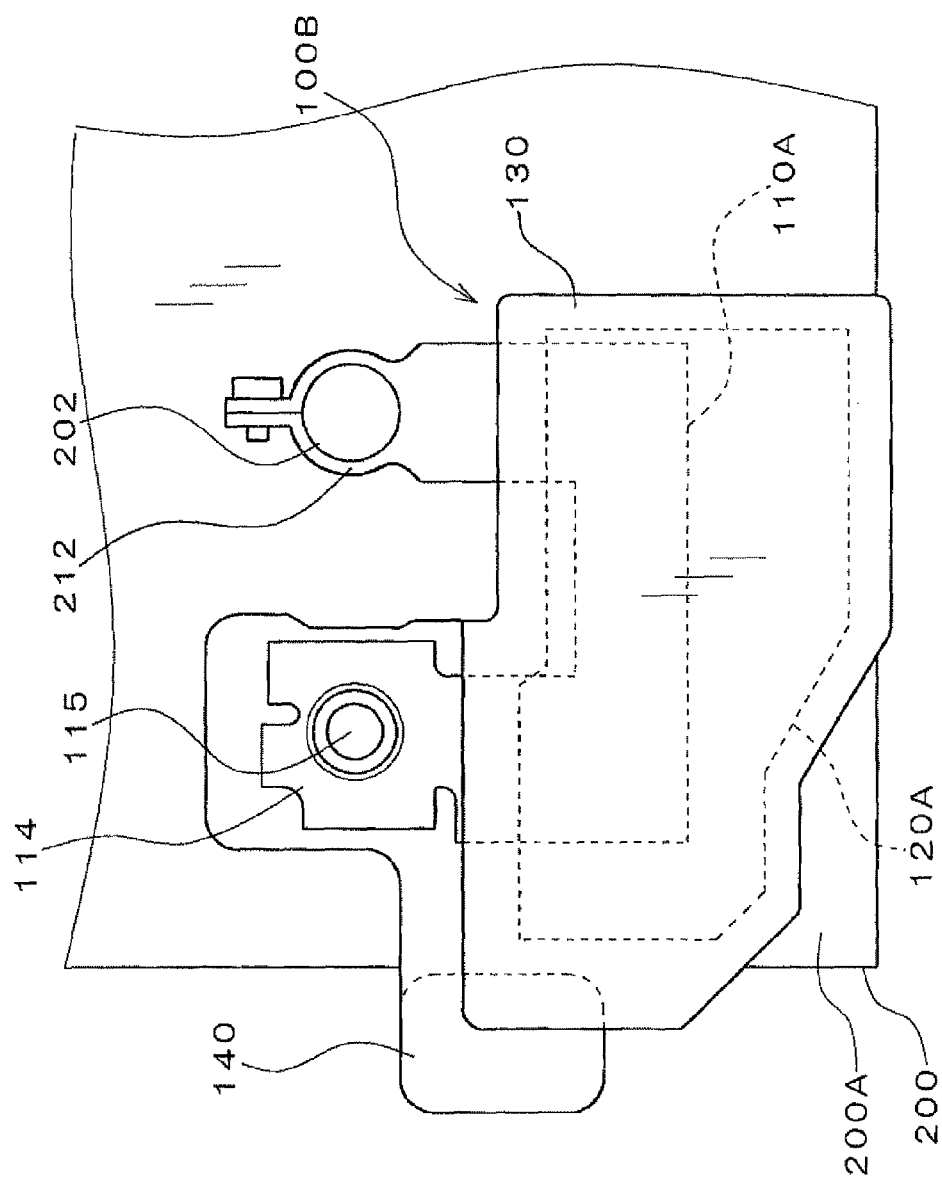
FIG. 5 is a planar view of another variation example of the current detecting device.

FIG. 5 is a planar view of another variation example of the current detecting device. A current detecting device 100B shown in FIG. 5 is disposed such that a large portion of the case 130, excluding the connector 140, and a circuit board 120A accommodated therewithin are each parallel with the upper surface 200A of the battery 200.

Unlike the bus bar 110 shown in FIG. 1 and the like, a bus bar 110A serving as a resistor has a C-shape rather than the folded shape. A current detecting circuit of the circuit board 120A detects the current flowing to the bus bar 110A based on the electrical potential at two points near both ends of the C-shaped bus bar 110A.

In the current detecting device 100B, the respective positions of the first and second fixed parts 212 and 114 are set such that the center of the second fixed part 114 is disposed within a circular area that, from the center of the first fixed part 212 is the radius of the second fixed part 114 multiplied by a predetermined value (preferably 3.5, as described above).

As a result, the moment force applied to the first fixed part 212 when the harness 300 is attached to the second fixed part 114 can be reduced, and quality and vibration-resistance of the first fixed part 212 can be improved with certainty. In particular, as a result of the bus bar 11A being formed into the C-shape, the distance between the first and second fixed parts 212 and 114 can be shortened.

Figure 6A:
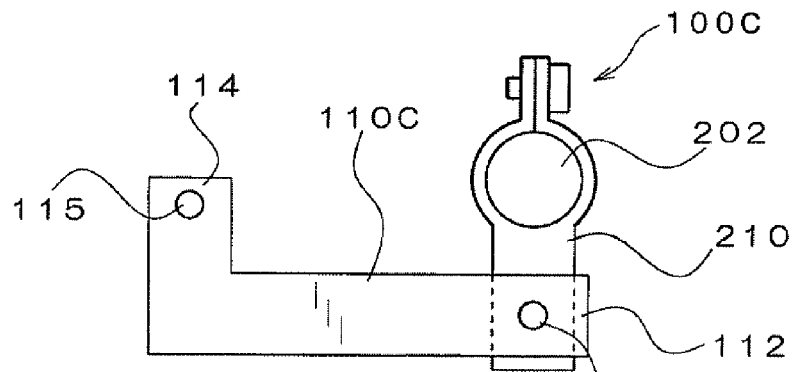
FIG. 6A to FIG. 6C are diagrams of overall configurations of other variation examples of the current detecting device.
Figure 6B:
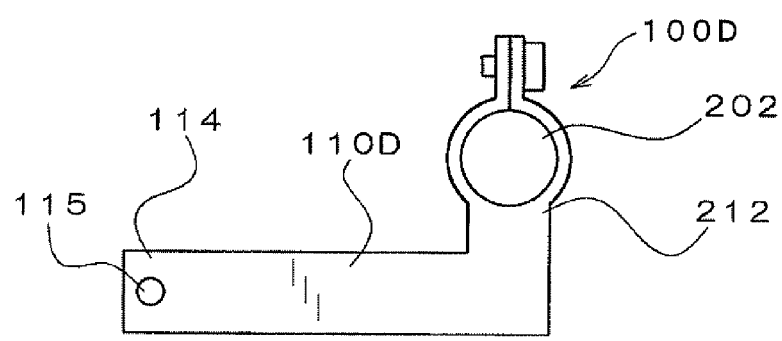
Figure 6C:
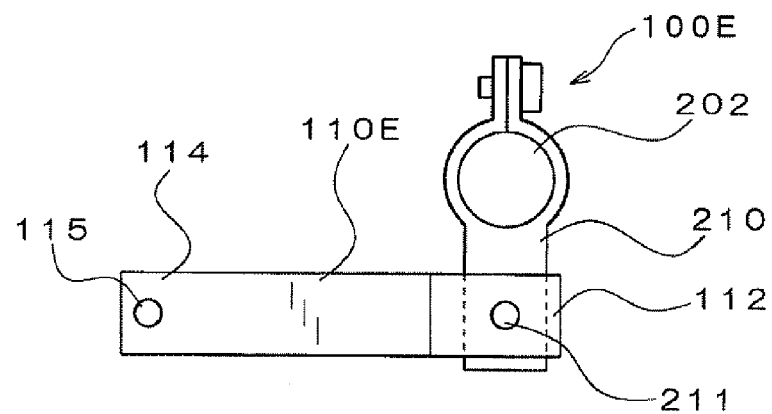

FIG. 6A to FIG. 6C are diagrams of overall configurations of other variation examples of the current detecting device. In FIG. 6A to FIG. 6C, the positional relationship between the first and second fixed parts, and a rough shape of the bus bar serving as a resistor are shown.

In the example shown in FIG. 6A, a current detecting device 100C having an L-shaped bus bar 110C is attached to the attachment fitting 210 attached to the negative-side terminal 202. The first and section fixed parts 112 and 114 are both disposed on the battery upper surface area.

In the example shown in FIG. 6B, a current detecting device 100D having an L-shaped bus bar 110D is directly attached to the negative-side terminal 202. The first and second fixed parts 212 and 114 are both disposed on the battery upper surface area.

In the example shown in FIG. 6C, a current detecting device 100E having a linear bus bar 110E that is folded back at two points is attached to the attachment fitting 210 attached to the negative-side terminal 202. The first and second fixed parts 112 and 114 are both disposed on the battery upper surface area.

Figure 7A:
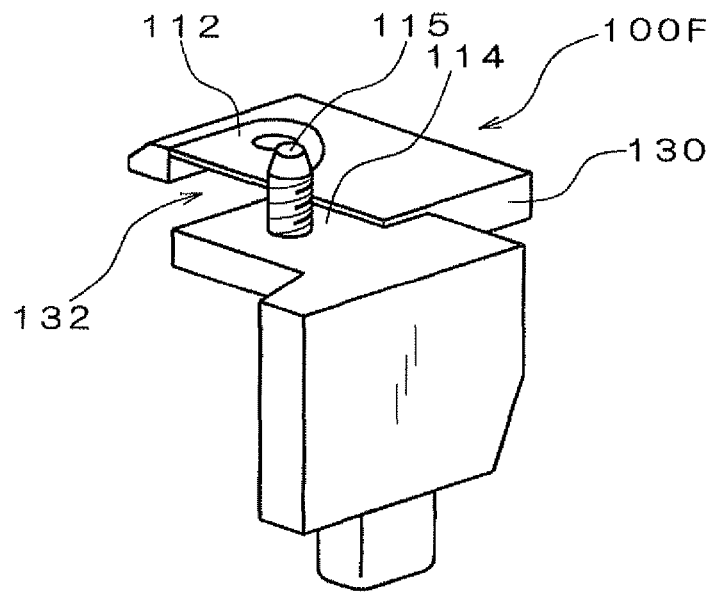
FIG. 7A and FIG. 7B are diagrams of another variation example of the current detecting device.
Figure 7B:
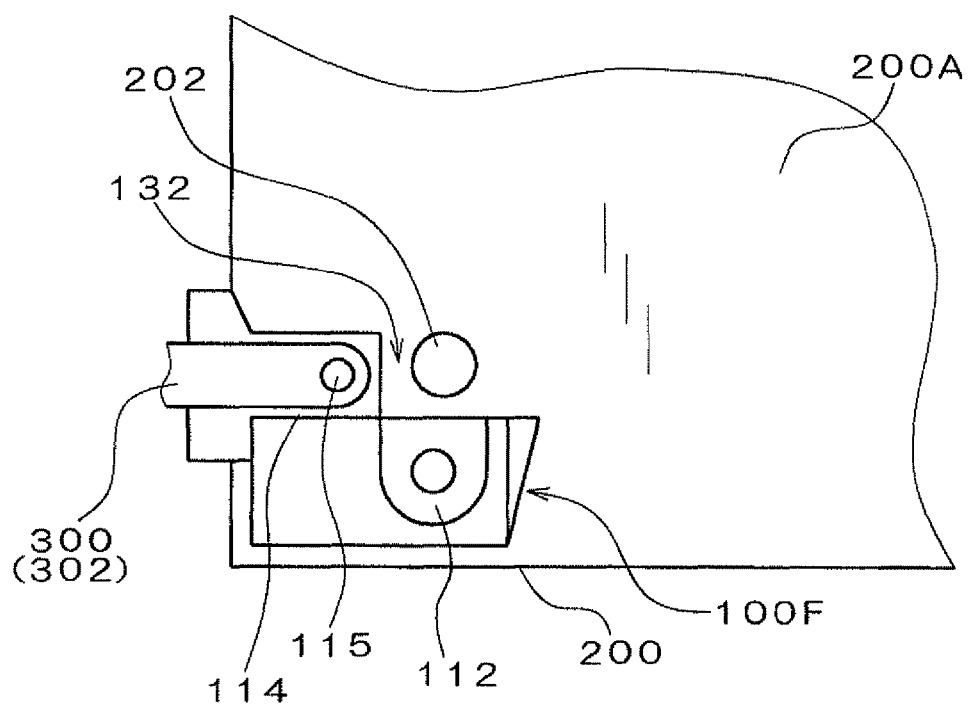

FIG. 7A and FIG. 7B are diagrams of another variation example of the current detecting device. FIG. 7A is a perspective view of the variation example of the current detecting device. FIG. 7B is a diagram of the variation example of the current detecting device viewed from the upper surface 200A of the battery 200.

As shown in FIG. 7A and FIG. 7B, a cut-out section 132 is provided in the case 130 of a current detecting device 100F of the variation example, in a position corresponding to the interior of the battery upper surface area.

The first fixed part 112 and the second fixed part 114 are disposed in an area opposing the cut-out section 132 (adjacent area). In addition, the negative-side terminal 202 of the battery 200 is disposed within the cut-out section 132. The second fixed part 114 and the negative-side terminal 202 are connected with the attachment fitting 210 therebetween (not shown in FIG. 7A and FIG. 7B).

As a result of the cut-out section 132 being provided in the case 130 of the current detecting device 100F, and the negative-side terminal 202, the first fixed part 112, and the second fixed part 114 being collectively disposed within or near the cut-out section 132 in this way, the distances between each fastening section thereof becomes short.

Therefore, the moment force applied to each section of the current detecting device 100F during fastening or during use can be reduced.

The present disclosure is not limited to the above-described embodiment. Various modifications can be made without departing from the spirit of the present disclosure. According to the above-described embodiment, when the bus bar 100 or the like is integrated with a resistor is described. However, a resistor separate from the bus bar 100 or the like may be used.

According to the above-described embodiment, the second fixed part 114 to which the bolt 115 is attached and fixed is described. However, the present disclosure can also be applied to when the second fixed part is formed by an attachment hole being formed in a penetrating manner, or when the second fixed part is formed by a crimped terminal.

According to the above-described embodiment, when a portion of the current detecting device 100 or the like is disposed in an area other than the upper surface 200A of the battery 200 is described. However, the entire current detecting device 100 or the like may be disposed on the battery upper surface area.

Furthermore, attachment may be performed in a state in which the lower surface of the second fixed part 114 (the lower surface of a head portion of the bolt 211 of the attachment fitting 210 to which the first fixed part 112 directly below the second fixed part 114 is attached, in the example shown in FIG. 1) is in contact with the battery upper surface 200A.

As a result, the amount of deflection of the second fixed part 114 to the lower side when the harness 300 is fixed to the second fixed part 114 can be kept to a minimum, and the moment force applied to the first fixed part 112 can be minimized.

As a result, further improvement in the quality and vibration-resistance of the first fitting section 112 can be achieved.

[Industrial Applicability]

As described above, in the present disclosure, as a result of the second fixed part 114 being disposed on the battery upper surface area, even when a load is applied when the harness 300 is fixed to the second fixed part 114, the amount of deflection of the second fixed part 114 in the load direction can be reduced.

Therefore, excessive moment can be prevented from being applied to the first fitting section 112. As a result, reduction in fastening strength of the first fixed part 112 and damage to the first fixed part 112 can be prevented, and the quality and vibration-resistance of the second fixed part 114 during vehicle assembly can be improved.

Furthermore, because the overall current detecting device 100 including the second fixed part 114 or the main section thereof is contained within the battery upper surface area, the space on the battery upper surface 200A can be effectively used, and mounting properties are enhanced.

What is claimed is:

1. A current detecting device that detects a current flowing through a battery terminal to a harness comprising: a fixed part to which the harness is fixed and electrically connected; a resistor inserted between the battery terminal and the fixed part; a circuit board in which a current detection circuit is mounted, the current detection circuit detecting current flowing through the resistor based on a potential difference between two points along an energizing direction of the resistor; and a case housing the resistor and the circuit board, wherein, the fixed part to which the harness is fixed and electrically connected is disposed within a battery upper surface area, and the fixed part is disposed within a circular area that is within the battery upper surface area and has a radius from the center of the battery terminal that is a radius of the battery terminal multiplied by a predetermined value.

2. The current detecting device according to claim 1, wherein, the predetermined value is 3.5.

3. The current detecting device according to claim 1, wherein,
the fixed part is any of a bolt that is attached and fixed, an attaching hole that is formed in a penetrating manner, and a crimped terminal.

4. The current detecting device according to claim 1, wherein,
attachment is performed in a state in which the lower surface of the fixed section is in contact with the battery upper surface.

5. The current detecting device according to claim 1, wherein,
the resistor has a non-linear shape.

6. The current detecting device according to claim 5, wherein,
the non-linear shape is a shape that is folded back midway and of which at least a portion is overlapping.

7. The current detecting device according to claim 5, wherein,
the non-linear shape is a C-shape or an L-shape.

8. The current detecting device according to claim 1, wherein,
a cut-out section is formed in the case within the battery upper surface area,
the battery terminal and the fixed part are each provided such as to oppose the cut-out section, and
a terminal provided in the battery within the battery upper surface area is disposed in the cut-out section.

9. The current detecting device according to claim 8, wherein,
the battery terminal and the fixed part are each provided in a position adjacent to the cut-out section.

* * * * *